United States Patent
Beale

(10) Patent No.: US 7,546,558 B2
(45) Date of Patent: Jun. 9, 2009

(54) METHOD AND APPARATUS FOR DETERMINING A PROCESS MODEL THAT USES FEATURE DETECTION

(75) Inventor: Daniel F. Beale, Portland, OR (US)

(73) Assignee: Synopsys, Inc., Mountain View, CA (US)

(*) Notice: Subject to any disclaimer, the term of this patent is extended or adjusted under 35 U.S.C. 154(b) by 137 days.

(21) Appl. No.: 11/728,089

(22) Filed: Mar. 23, 2007

(65) Prior Publication Data

US 2007/0174808 A1 Jul. 26, 2007

(51) Int. Cl.
G06F 17/50 (2006.01)

(52) U.S. Cl. ............................................. 716/1; 716/21
(58) Field of Classification Search ................ 716/1, 716/21
See application file for complete search history.

(56) References Cited

U.S. PATENT DOCUMENTS

| | | | |
|---|---|---|---|
| 5,991,006 A * | 11/1999 | Tsudaka | 355/53 |
| 6,289,499 B1 * | 9/2001 | Rieger et al. | 716/21 |
| 7,053,355 B2 * | 5/2006 | Ye et al. | 250/208.1 |
| 2005/0268256 A1 * | 12/2005 | Tsai et al. | 716/4 |
| 2005/0278060 A1 * | 12/2005 | Furuya | 700/182 |
| 2008/0104555 A1 * | 5/2008 | DeMaris et al. | 716/4 |

* cited by examiner

*Primary Examiner*—Jack Chiang
*Assistant Examiner*—Suchin Parihar
(74) *Attorney, Agent, or Firm*—Park, Vaughan & Fleming LLP

(57) ABSTRACT

One embodiment can provide a system for determining a process model that models an effect of one or more semiconductor manufacturing processes. During operation, the system can receive a test layout. Next, the system can receive empirical data which is obtained using a process that includes subjecting the test layout to one or more semiconductor manufacturing processes. The system can then receive a set of functions which includes a feature-detecting function, wherein the feature-detecting function's value at an evaluation point is associated with the presence of a particular shape in proximity to the evaluation point. Next, the system can determine the process model using the test layout, the empirical data, and the set of functions.

16 Claims, 4 Drawing Sheets

METHOD AND APPARATUS FOR DETERMINING A PROCESS MODEL THAT USES FEATURE DETECTION

RELATED APPLICATION

This application is related to U.S. Pat. No. 7,234,129, entitled, "CALCULATING ETCH PROXIMITY-CORRECTION USING OBJECT-PRECISION TECHNIQUES," by inventors Dan Beale, Jim Shiely, and John Stimiman, filed on 29th Sep. 2004. Further, this application is related to U.S. patent application Ser. No. 11/357,304, entitled, "METHOD AND APPARATUS FOR DETERMINING A PROXIMITY CORRECTION USING A VISIBLE AREA MODEL, " by inventor Dan Beale, filed on 17th Feb. 2006.

BACKGROUND

1. Field of the Invention

The present invention relates to integrated circuit design and fabrication. More specifically, the present invention relates to a method and an apparatus to determine a process model that uses feature detection.

2. Related Art

The relentless miniaturization of integrated circuits has been a key driving force behind recent advances in computer technology. Miniaturization has been made possible by, among other things, improvements in process models. Process models can be used during a number of stages in the design and fabrication flow. For example, OPC (Optical Proximity Correction) can use process models to determine proximity corrections which can allow the system to generate the desired feature shapes on the wafer. Process model accuracy is becoming increasingly important as semiconductor integration densities continue to increase at an exponential rate.

A process model models the behavior of one or more semiconductor manufacturing processes which typically involve complex physical and chemical interactions. Since it is almost impossible to find exact analytical formulae to predict the behavior of these complex interactions, generic modeling functions may be used to model these processes.

Once these process models are found, they can be used to make corrections to layouts to compensate for undesirable effects of a semiconductor manufacturing process. Alternatively, process models can be used to predict the patterns that are formed when a layout is subjected to one or more semiconductor manufacturing processes.

The accuracy of process models usually affects the effectiveness of the applications that use the process models. Hence, it is generally desirable to improve the accuracy of process models because it can improve the effectiveness of the applications.

SUMMARY

An embodiment provides a technique for determining a robust process model that is accurate across different layout geometries. An embodiment enables a kernel to be created that is sensitive to a feature or shape. A process model can then use the kernel to predict the effects of one or more semiconductor manufacturing processes. Using such feature-detecting kernels can substantially improve the accuracy of the process model because these kernels can be specifically designed to be sensitive to certain types of shapes.

An embodiment can receive a test layout. Next, the system can receive empirical data which is generated by subjecting the test layout to one or more semiconductor manufacturing processes. The system can then receive a set of kernels, wherein at least one kernel in the set of kernels includes a visible-area term or a blocked-area term. The visible-area term's value at an evaluation point in the test layout is associated with a visible area at the evaluation point. The blocked-area term's value at an evaluation point in the test layout is associated with a blocked area at the evaluation point. Next, the system can determine an improved process model using the test layout, the empirical data, and the set of kernels.

DETAILED DESCRIPTION

Integrated Circuit (IC) Design Flow

Figure 1:
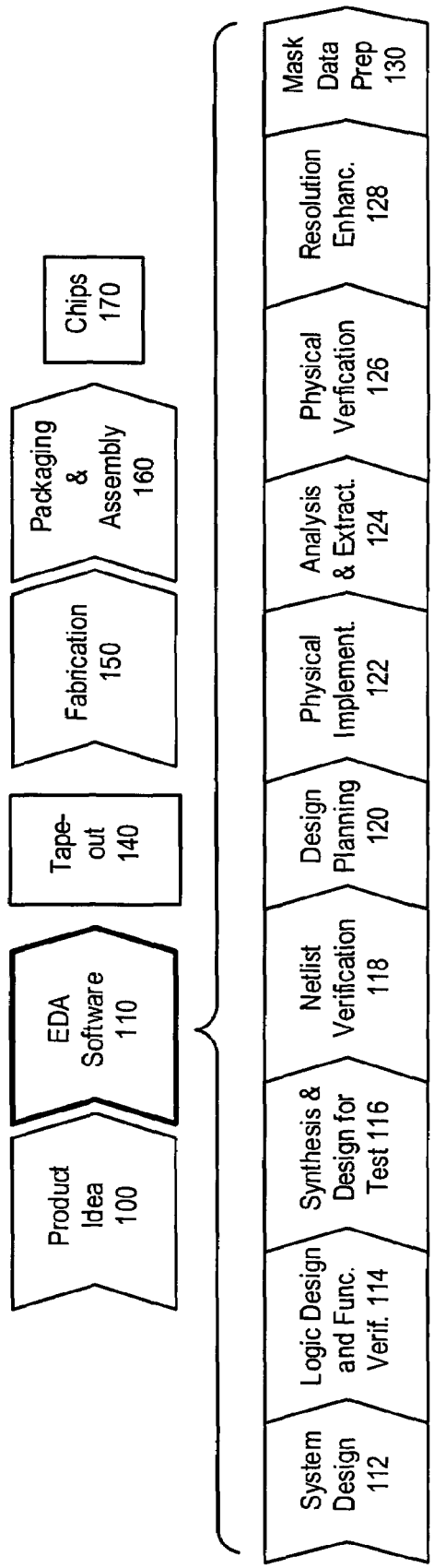
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the conception of the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above-described steps. Specifically, one embodiment of the present invention can be used during the resolution enhancement step 128.

Process Model

A conventional approach has been to develop tables of geometrical rules which move a polygon line segment according to, e.g., the width of the line and the perpendicular distance to the nearest neighbor feature. Processes which could not be modeled via simple empirical extensions to optical models were approximated using this rules table approach. However, due to the exponential increase in integration densities, rules tables have become unwieldy and inaccurate. One embodiment of the present invention replaces these unwieldy and inaccurate rules tables with models that are, like rules, sensitive to exact polygon geometry. The model forms described here can be used as a more accurate and easier-to-calibrate replacement for retarget rules and design rule check (DRC) rules.

A process model models the behavior of one or more semiconductor manufacturing processes which typically involve complex physical and chemical interactions. The process model may treat the modeled process as bulk components, which means that atomic and molecular level effects may be treated as a whole.

A process model is usually determined by fitting kernel coefficients to empirical data. The empirical data is usually generated by applying the semiconductor manufacturing processes that are being modeled to one or more test layouts. For example, an optical lithography process can be used to print a test layout on a wafer. Next, the empirical data can be obtained by measuring the critical dimensions (CD) of features on the resulting wafer before and/or after the etch process. The process model can then be fit to the empirical data to determine a process model that models the optical lithography process and/or the etch process.

Once a process model is determined, it can be used for a number of purposes during the design and manufacture of a semiconductor chip. For example, process models are typically used to support Optical Proximity Correction (OPC) and Resolution Enhancement Techniques (RET). These models can allow full-chip database manipulation in reasonable timeframes during the tapeout flow.

A process model can include functions or kernels that are associated with parameters and/or coefficients which are statistically fit to empirical data. A function or a kernel can be any mathematical expression.

For example, a process model, P, may be represented as $$P = \sum_i C_i K_i,$$

where $K_i$ is the $i^{th}$ function or kernel, and $C^i$ is the $i^{th}$ coefficient which is associated with $K_i$. The empirical data may include values of a desired property, e.g., the CD, at different locations in the layout. Once the process model is fit to the empirical data, it can then be used to predict the value of the desired property for other layouts.

Ideally, we would want to determine coefficient values which will cause the predicted data to exactly match the empirical data. However, an exact fit is usually not possible, and even if it is possible, it may not be desirable because the resulting process model may not interpolate and/or extrapolate properly. Hence, statistical fitting techniques are typically used to determine the coefficients so that the error between the empirical data and the predicted data is minimized. In one embodiment, the system can use a least-squares fitting technique to determine the coefficient values.

A process model is considered to be robust if it interpolates and extrapolates well, i.e., if the process model generates accurate results when it is applied to layouts that are different from the layouts that were used during the fitting process. Not surprisingly, robustness is a desirable characteristic. In general, the fewer modeling functions or kernels that a process model uses, the more robust it is. However, using fewer kernels may decrease the process model's accuracy. Hence, in conventional modeling techniques, there is usually a tradeoff between the robustness and the accuracy of a process model.

A semiconductor manufacturing process's effects may depend on the layout geometry. For example, a semiconductor manufacturing process may behave differently at short line-ends than at long line-ends. Similarly, a process may behave differently at line ends than at line edges. In such situations, conventional modeling techniques may not be able to find a robust process model that accurately models the semiconductor manufacturing process across different layout geometries. For example, a process model may accurately predict the behavior at long line-ends, but may fail miserably at short line-ends.

Conventional modeling techniques fail in such scenarios because conventional modeling functions usually cannot "detect" specific features. For example, conventional techniques typically use a high-pass-filter kernel to identify regions that have high spatial frequency components. However, these kernels are quite indiscriminate, and cannot detect specific features.

One embodiment of the present invention uses feature-detecting kernels and/or functions to determine a process model that is robust and accurate across different layout geometries. An embodiment uses a feature-detecting function that includes a visible area term and/or a blocked area term. The value of the visible area term at an evaluation point is associated with an area that is visible from the evaluation point. The value of the blocked area term at an evaluation point is associated with an area that is visible from the evaluation point in the "inverse" layout. The following text first describes the concept of a visible area and a blocked area, and then describes how a visible area term and/or a blocked area term can be used to detect features.

Visible Area and Blocked Area

Figure 2A:
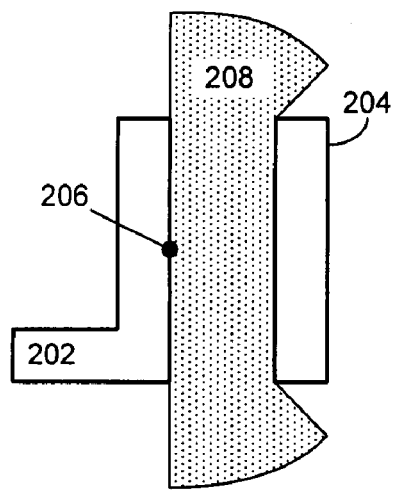
FIGS. 2A-2C illustrate a visible area and a blocked area in accordance with an embodiment of the present invention.
Figure 2B:
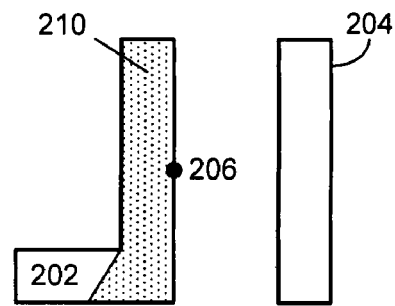

FIGS. 2A and 2B illustrate a visible area and a blocked area in accordance with an embodiment of the present invention.

Polygons 202 and 204 are part of a layout. Visible area 208 shown in FIG. 2A is the area that is visible from evaluation point 206. In other words, if polygons 202 and 204 were assumed to be opaque structures, visible area 208 would be the area that is visible from evaluation point 206. Note that visible area 208 can potentially extend to infinity, but as shown FIG. 2A, the area is usually "cut off" at a particular distance from the evaluation point. The "cut off" distance can depend on the interaction range, which can be different for different applications.

Blocked area 210 shown in FIG. 2B illustrates the blocked area that is associated with evaluation point 206. Blocked area 210 can be viewed as the area that is "visible" within the polygon from evaluation point 206. In other words, if polygon 202 was assumed to be transparent and the space around polygon 202 was assumed to be opaque, blocked area 210 would then be the area that was visible from evaluation point 206. Just like the visible area, the blocked area can also be "cut off" at a particular distance.

Figure 2C:
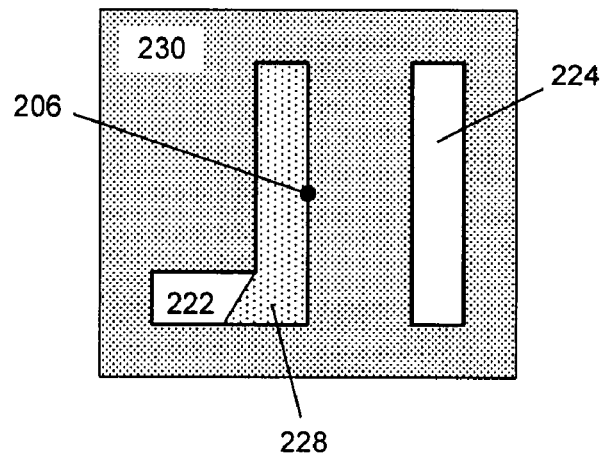

FIG. 2C illustrates how the blocked area can be viewed as the visible area in an inverted layout in accordance with an embodiment of the present invention.

In the inverted layout shown in FIG. 2C, polygons 202 and 204 (shown in FIG. 2B) have been converted into spaces 222 and 224. The space surrounding polygons 202 and 204 (shown in FIG. 2B) has been converted into opaque area 230. Blocked area 210 (shown in FIG. 2B) is equal to the visible area 228 associated with evaluation point 206 in the inverted layout shown in FIG. 2C. In other words, the blocked area at an evaluation point can be determined by computing the visible area at the evaluation point in an inverted layout.

One embodiment uses a kernel whose value at an evaluation point is equal to the value of an integral of a function over a visible area or a blocked area at an evaluation point. A number of techniques can be used to determine the value of the integral. For example, the value of the integral can be determined using image precision techniques, object precision techniques, or by using a non-linear filter. An image precision technique is described in U.S. patent application Ser. No. 10/955,189, entitled, "CALCULATING ETCH PROXIMITY-CORRECTION USING IMAGE-PRECISION TECHNIQUES," which is hereby incorporated by reference. An object precision technique is described in U.S. patent application Ser. No. 10/955,532, entitled, "CALCULATING ETCH PROXIMITY-CORRECTION USING OBJECT-PRECISION TECHNIQUES," which is hereby incorporated by reference. A technique that uses a non-linear filter is described in U.S. patent application Ser. No. 11/357,304, entitled, "METHOD AND APPARATUS FOR DETERMINING A PROXIMITY CORRECTION USING A VISIBLE AREA MODEL," which is hereby incorporated by reference. U.S. patent application Ser. No. 11/357,304 also describes a technique to create a visible area function that is continuous across a polygon's edge.

Feature Detecting Functions or Kernels

Figure 3A:
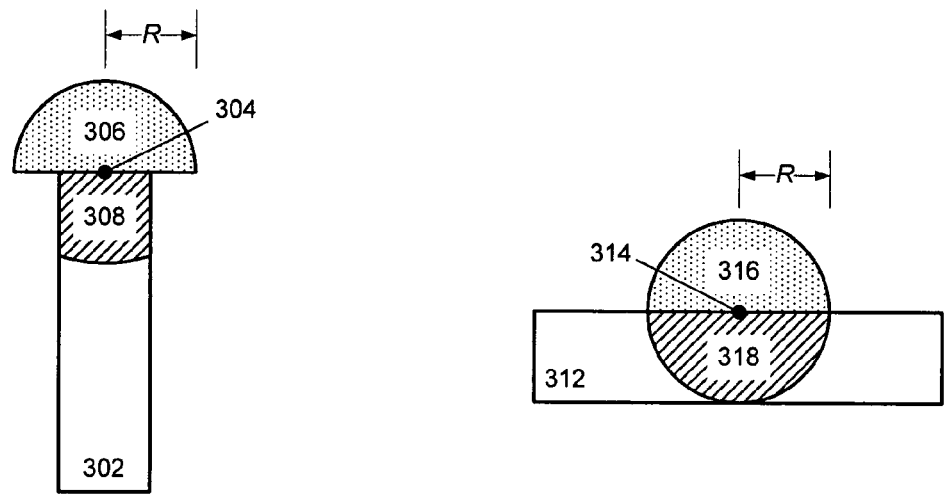
FIG. 3A illustrates how a visible area term and a blocked area term can be used to detect a line-end whose width is less than a given value in accordance with an embodiment of the present invention.

FIG. 3A illustrates how a visible area term and a blocked area term can be used to detect a line-end whose width is less than a given value in accordance with an embodiment of the present invention.

Evaluation point 304 is located at a line-end of line 302, and evaluation point 314 is located at a line-edge of line 312. Note that the visible area 306 is greater than the blocked area 308. On the other hand, the visible area 316 is equal to the visible area 318.

A line-end detector can be created by taking the difference between a visible area term and a blocked area term. A visible area term can be a function or a kernel whose value at an evaluation point is associated with the visible area at the evaluation point. For example, a visible area term can be an integral of a function over the visible area. Similarly, a blocked area term can be a function or a kernel whose value at an evaluation point is associated with the blocked area at the evaluation point. For example, a blocked area term can be an integral of a function over the blocked area. Note that a visible area term and/or a blocked area term can be continuous across polygon boundaries. Specifically, the "extinction length" concept, which is described in U.S. patent application Ser. No. 11/357,304, can be used to create a visible area term and/or a blocked area term that is continuous across a polygon's boundary.

In one embodiment, a line-end detector can be expressed as $(V_R(x)-B_R(x))$, where $V_R(x)$ and $B_R(x)$ are the values of the visible area term and the blocked area term, respectively, at location x. Note that this line-end detector may return a zero value for line ends whose length is greater than or equal to 2·R, where R is the radius of the interaction range. For example, the line-end detector would return a zero value at evaluation point 314. For line ends whose length is less than 2·R, the line-end detector returns a non-zero value. For example, the line-end detector would return a non-zero value at evaluation point 304. The radius, R, can be chosen so that the line-end detector detects line-ends whose width is less than a given value. In another embodiment, the radius of the visible area may be different from the radius of the blocked area. Note that the interaction region can be any arbitrary shape.

Figure 3B:
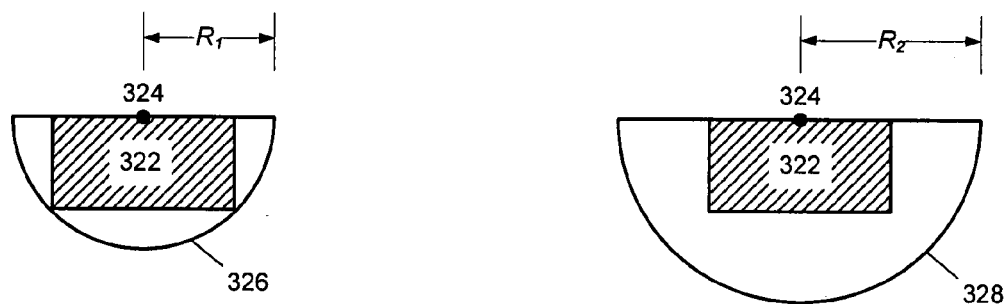
FIGS. 3B and 3C illustrate how two blocked area terms can be used to detect a line whose length is less than a given value in accordance with an embodiment of the present invention.
Figure 3C:
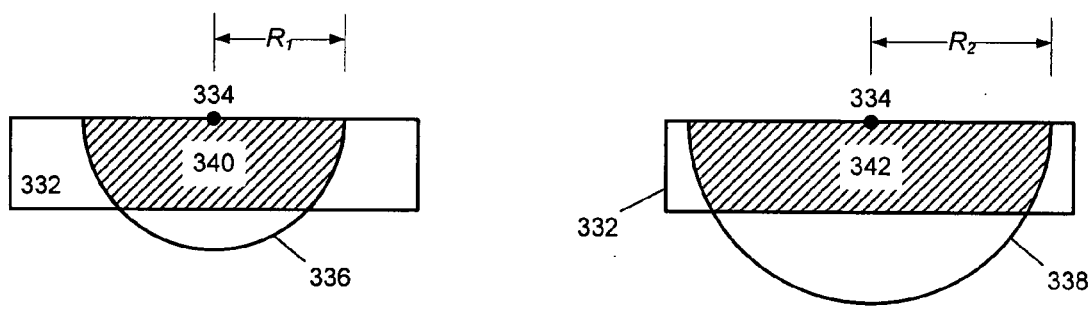

FIGS. 3B and 3C illustrate how two blocked area terms can be used to detect a line whose length is less than a given value in accordance with an embodiment of the present invention.

Evaluation point 324 is located on an edge of line 322 as shown in FIG. 3B. A first blocked area term, $B_1$, is associated with the blocked area within interaction region 326 which has a radius $R_1$. A second blocked area term, $B_2$, is associated with the blocked area within interaction region 328 which has a radius $R_2$. For line 322, both $B_1$ and $B_2$ are associated with the same area, namely, the area of line itself.

However, if the line is longer, these two blocked area terms will be different. For example, consider line 332 shown in FIG. 3C. Evaluation point 334 is located on an edge of line 332. The first blocked area term, $B_1$, is associated with the blocked area within interaction range 336 which has a radius $R_1$. The second blocked area term, $B_2$, is associated with the blocked area within interaction range 338 which has a radius $R_2$. For line 332, the blocked area terms are different. Blocked area 340 (which is associated with $B_1$) is less than blocked area 342 (which is associated with $B_2$).

In one embodiment, a line-length detector can be expressed as $(B_2(x)-B_1(x))$, where $B_1(x)$ and $B_2(x)$ are the values of the blocked area terms at evaluation point x. Note that this line-length detector may return a zero value for lines whose length is less than or equal to line 322's length. For example, the line-length detector would return a zero value at evaluation point 324. However, for lines whose length is greater than line 322's length, the line-length detector may return a non-zero value. For example, the line-length detector would return a non-zero value at evaluation point 334 on line 332.

Note that the line-length detector's value may linearly increase as a line's length increases from line 322's length to $2 \cdot R_2$. Beyond $2 \cdot R_2$, the line-length detector's value may remain constant.

In one embodiment, the two blocked areas can be used to determine an approximate line length. For example, a line-length detector can determine a ratio between $A_1(x)$ and $A_2(x)$, where $A_1(x)$ and $A_2(x)$ are the two blocked areas. If $R_1$ is sufficiently small and $R_2$ is sufficiently large, the expression $$\frac{A_2(x)}{A_1(x)} \cdot 2 \cdot R_1$$

can be used as an approximation of the line's length. Specifically, if $R_1$ and $R_2$ are chosen appropriately, $A_1(x)$ can approximately be equal to the area of a section of the line whose length is $2 \cdot R_1$, and $A_2(x)$ can be equal to the area of the whole line. In such a scenario, $$\frac{A_2(x)}{A_1(x)} \cdot 2 \cdot R_1$$

can be an approximation to the line's length.

The foregoing descriptions of feature detecting functions or kernels have been presented only for purposes of illustration and description. They are not intended to be exhaustive or to limit the present invention to the forms disclosed. Accordingly, many modifications and variations will be readily apparent to practitioners skilled in the art.

For example, the line-end detector which was illustrated in FIG. 3A, can also be used as a width detector. Specifically, if the width of line 312 was less than R, the expression $(V_R(x)-B_R(x))$ would have a non-zero value. However, if the width of line 312 is greater than or equal to R, the expression $(V_R(x)-B_R(x))$ would be equal to zero. Hence, the expression $(V_R(x)-B_R(x))$ can also be used as a width detector. Similarly, other modifications and variations will be readily apparent to practitioners skilled in the art. For example, feature-detecting kernels may be constructed for a number of 2-D (2 dimensional) features, such as, corners, jogs, etc.

Determining a Process Model

Figure 4:
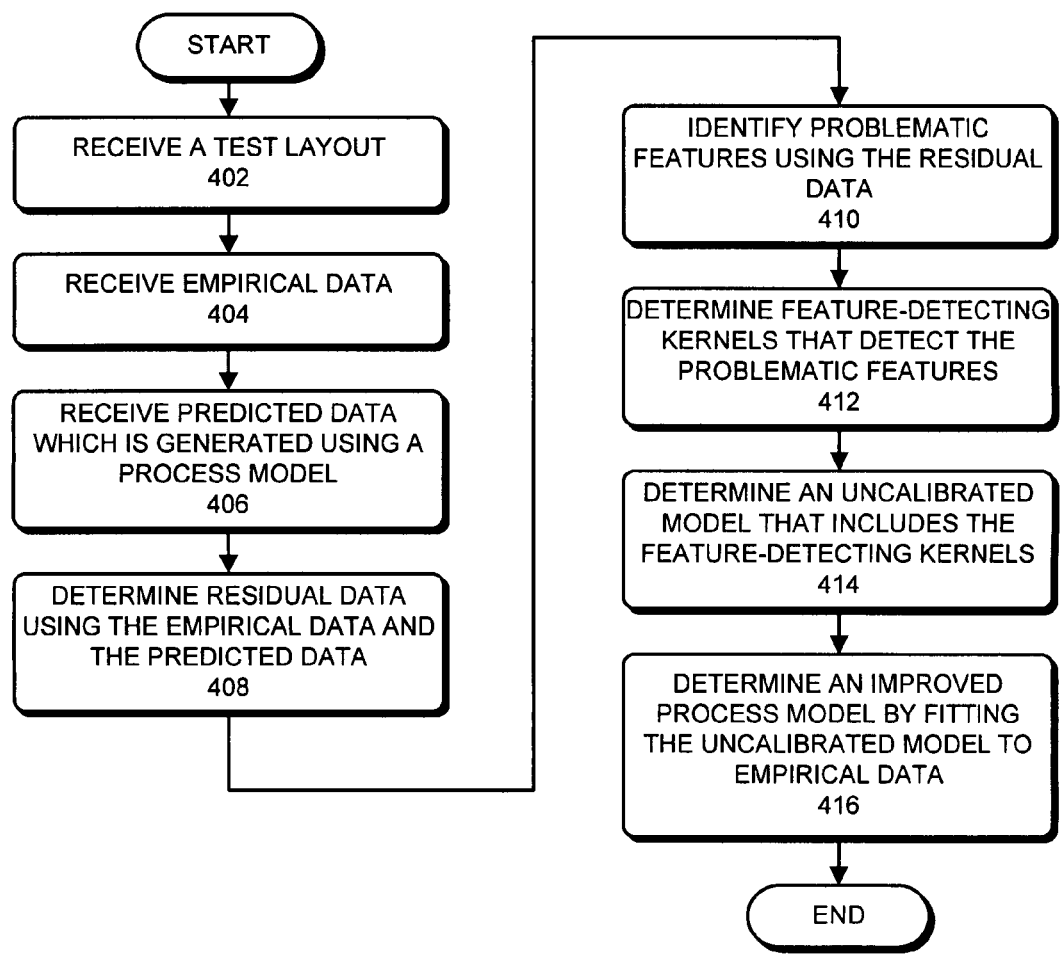
FIG. 4 presents a flowchart that illustrates a process for determining a process model in accordance with an embodiment of the present invention.

FIG. 4 presents a flowchart that illustrates a process for determining a process model in accordance with an embodiment of the present invention.

The process can begin by receiving a test layout (stage 402).

Next, the system can receive empirical data (stage 404). The empirical data can be obtained by subjecting the test layout to one or more semiconductor manufacturing processes.

The system can then receive predicted data which is generated using a process model (stage 406). The process model may be determined by fitting a conventional process model to the empirical data. Recall that conventional process models usually do not have feature-detecting kernels.

Next, the system can determine residual data using the empirical data and the predicted data (stage 408). The residual data can represent the difference or error between the predicted data and the empirical data.

The system can then identify problematic features using the residual data (stage 410). For example, the residual data may indicate that the difference between the empirical data and the predicted data is unacceptably large at short line-ends, which may mean that a short line-end is a problematic feature.

Next, the system can determine feature-detecting kernels that detect the problematic features (stage 412). For example, suppose the difference between the predicted data and the empirical data is large for line-ends whose length is less than $L_1$. In this case, a line-end detecting kernel can be used that detects line-ends whose length is shorter than or equal to $L_1$. As explained above, a kernel may be constructed using a visible area term and a blocked area term so that the kernel's value is non-zero only for line-ends that are shorter than $L_1$.

The system can then determine an uncalibrated model that includes the feature-detecting kernels (stage 414). A model can use a feature-detecting kernel in a number of ways, which will be readily apparent to practitioners skilled in the art. For example, the system may include the feature-detecting kernel as an additional term in the model. Alternatively, the system may multiply the feature-detecting kernel with other kernels, and use the product terms in the model.

Next, the system can determine an improved process model by fitting the uncalibrated model to empirical data (stage 416). The empirical data that is used in this stage can either be the same or it can be different from the empirical data that was received in stage 404.

The improved process model may be represented as a sum of product terms. A product term may include a kernel and a coefficient, wherein the system fits the coefficient to the empirical data. In one embodiment, the system may fit only a subset of the coefficients. For example, the system may fit only those coefficients that are associated with the new feature-detecting kernels. The system may fit the coefficients using a least-square fitting technique or another statistical fitting technique.

Next, the system may store the coefficients in a computer-readable storage medium. In one embodiment, the system may store coefficients, kernel identifiers, and information that associates the coefficients with their respective kernel identifiers. A kernel identifier can be a string that identifies a kernel. Alternatively, a kernel identifier can be an expression that represents the kernel.

Figure 5:
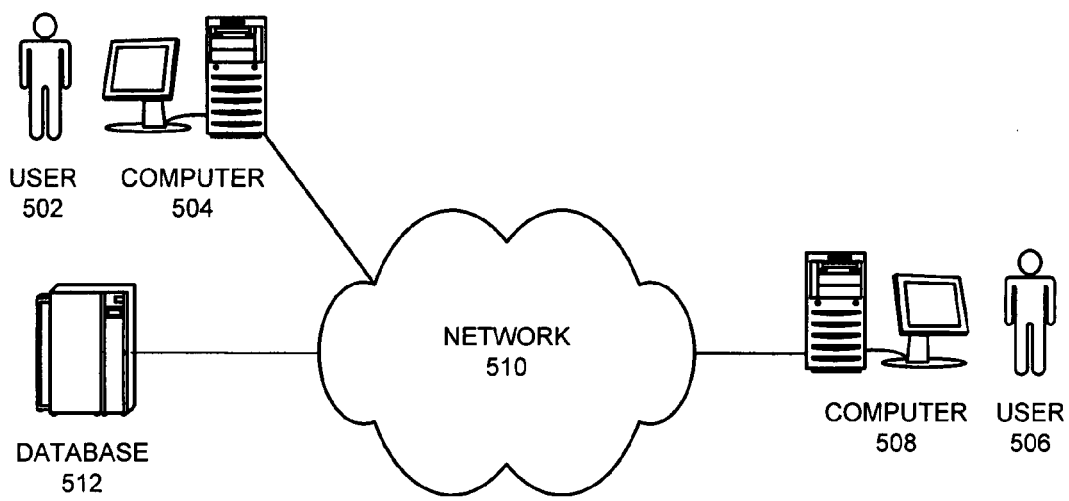
FIG. 5 illustrates how a system can store coefficients in a computer-readable storage medium in accordance with an embodiment of the present invention.

FIG. 5 illustrates how a system can store coefficients in a computer-readable storage medium in accordance with an embodiment of the present invention.

User 502 may use computer 504 to fit the coefficients to the empirical data. Next, user 502 may store the coefficients and the kernel identifiers on computer 504's hard disk or a removable computer-readable storage medium. Alternatively, user 502 may store the coefficients and kernel identifiers on database 512 which is coupled to computer 504 via network 510. User 506 may receive the coefficients and kernel identifiers from user 502 over network 510. Alternatively, user 506 may retrieve the coefficients and kernel identifiers from database 512. User 506 can load the improved process model on computer 508 by reading the stored coefficients and the kernel identifiers.

The improved process model can be used for a number of purposes. For example, the system may receive a layout. Next, the system may use the improved process model to determine a proximity correction. Alternatively, the system may use the improved process model to predict a pattern which is expected to be generated if the layout is subjected to the semiconductor manufacturing processes that are being modeled.

Many modifications and variations of the process will be readily apparent to practitioners skilled in the art. For example, in one embodiment, the system can receive a test layout. Next, the system can receive empirical data which is obtained using a fabrication process that includes subjecting the test layout to one or more semiconductor manufacturing processes. The system can then receive a set of functions which includes a feature-detecting function, wherein the feature-detecting function's value at an evaluation point is associated with the presence of a particular shape in proximity to the evaluation point. Specifically, the system may receive a set of kernels, wherein at least one kernel in the set of kernels includes a blocked-area term, wherein the blocked-area term's value at an evaluation point in the test layout is associated with a blocked area at the evaluation point. Next, the system can determine a process model using the test layout, the empirical data, and the set of functions.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for determining a process model that models an effect of one or more semiconductor manufacturing processes, the method comprising:
   receiving a test layout;
   receiving empirical data which is generated by subjecting the test layout to said one or more semiconductor manufacturing processes;
   receiving a set of kernels, wherein at least one kernel in the set of kernels includes a blocked-area term, wherein the blocked-area term's value at an evaluation point in the test layout is associated with a blocked area at the evaluation point; and
   determining, by computer, the process model using the test layout, the empirical data, and the set of kernels by:
      representing the process model as a sum of product terms, wherein a product term includes:
         a kernel in the set of kernels; and
         a coefficient in a set of coefficients;
      fitting the set of coefficients to the empirical data; and
      storing the set of coefficients in a computer-readable storage medium.

2. The method of claim 1, further comprising:
   receiving a first layout; and
   determining a proximity correction using the first layout and the process model.

3. The method of claim 1, further comprising:
   receiving a first layout; and
   determining a first pattern using the first layout and the process model, wherein the first pattern is expected to be generated if the first layout is subjected to said one or more semiconductor manufacturing processes.

4. A first computer-readable storage medium storing instructions that when executed by a computer cause the computer to perform a method for determining a process model that models an effect of one or more semiconductor manufacturing processes, the method comprising:
   receiving a test layout;
   receiving empirical data which is generated by subjecting the test layout to said one or more semiconductor manufacturing processes;
   receiving a set of kernels, wherein at least one kernel in the set of kernels includes a blocked-area term, wherein the blocked-area term's value at an evaluation point in the test layout is associated with the blocked area at the evaluation point; and
   determining the process model using the test layout, the empirical data, and the set of kernels by:
      representing the process model as a sum of product terms, wherein a product term includes:
         a kernel in the set of kernels; and
         a coefficient in a set of coefficients;
      fitting the set of coefficients to the empirical data; and
      storing the set of coefficients in a second computer-readable storage medium.

5. The computer-readable storage medium of claim 4, the method further comprising:
   receiving a first layout; and
   determining a proximity correction using the first layout and the process model.

6. The computer-readable storage medium of claim 4, the method further comprising:
   receiving a first layout; and
   determining a first pattern using the first layout and the process model, wherein the first pattern is expected to be generated if the first layout is subjected to said one or more semiconductor manufacturing processes.

7. A method for determining a process model that models an effect of one or more semiconductor manufacturing processes, the method comprising:
   receiving a test layout;
   receiving empirical data which is obtained using a process that includes subjecting the test layout to said one or more semiconductor manufacturing processes;
   receiving a set of functions which includes a feature-detecting function, wherein the feature-detecting function's value at an evaluation point is associated with the presence of a particular shape in proximity to the evaluation point; and determining, by computer, the process model using the test layout, the empirical data, and the set of functions by:
representing the process model as a sum of product terms, wherein a product term includes:
a function in the set of functions; and
a coefficient associated with the function;
determining the coefficient's value using the empirical data; and
storing the coefficient's value in a second computer-readable storage medium.

8. The method of claim 7, wherein the feature-detecting function includes a visible-area term.

9. The method of claim 7, wherein the feature-detecting function includes a blocked-area term.

10. The method of claim 7, further comprising:
receiving a first layout; and
determining a proximity correction using the first layout and the process model.

11. The method of claim 7, further comprising:
receiving a first layout; and
determining a first pattern using the first layout and the process model, wherein the first pattern is expected to be generated if the first layout is subjected to said one or more semiconductor manufacturing processes.

12. A first computer-readable storage medium storing instructions that when executed by a computer cause the computer to perform a method for determining a process model that models an effect of one or more semiconductor manufacturing processes, the method comprising:
receiving a test layout;
receiving empirical data which is obtained using a process that includes subjecting the test layout to said one or more semiconductor manufacturing processes;
receiving a set of functions which includes a feature-detecting function, wherein the feature-detecting function's value at an evaluation point is associated with the presence of a particular shape in proximity to the evaluation point; and
determining the process model using the test layout, the empirical data, and the set of functions by:
representing the process model as a sum of product terms, wherein a product term includes:
a function in the set of functions; and
a coefficient associated with the function;
determining the coefficient's value using the empirical data; and
storing the coefficient's value in a second computer-readable storage medium.

13. The computer-readable storage medium of claim 12, wherein the feature-detecting function includes a visible-area term.

14. The computer-readable storage medium of claim 12, wherein the feature-detecting function includes a blocked-area term.

15. The computer-readable storage medium of claim 12, the method further comprising:
receiving a first layout; and
determining a proximity correction using the first layout and the process model.

16. The computer-readable storage medium of claim 12, the method further comprising:
receiving a first layout; and
determining a first pattern using the first layout and the process model, wherein the first pattern is expected to be generated if the first layout is subjected to said one or more semiconductor manufacturing processes.

* * * * *